US008633681B2

(12) United States Patent
Chu

(10) Patent No.: US 8,633,681 B2
(45) Date of Patent: Jan. 21, 2014

(54) VOLTAGE REGULATOR AND VOLTAGE REGULATION METHOD

(75) Inventor: Gyo Soo Chu, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 243 days.

(21) Appl. No.: 13/178,764

(22) Filed: Jul. 8, 2011

(65) Prior Publication Data

US 2012/0181995 A1    Jul. 19, 2012

(30) Foreign Application Priority Data

Jan. 13, 2011    (KR) .......................... 10-2011-0003606

(51) Int. Cl.
*G05F 1/00*    (2006.01)
*G05F 1/12*    (2006.01)

(52) U.S. Cl.
USPC ............................ 323/271; 323/282; 323/297

(58) Field of Classification Search
USPC .................................. 323/269–274, 282, 297
See application file for complete search history.

(56) References Cited

U.S. PATENT DOCUMENTS

| 4,400,660 | A  | * | 8/1983  | Schaefer ..................... 323/270 |
| 5,907,237 | A  | * | 5/1999  | Sekimoto ..................... 323/282 |
| 7,573,152 | B2 | * | 8/2009  | Jacob et al. .................. 307/19 |
| 2004/0232899 | A1 | * | 11/2004 | Herbert ........................ 323/282 |
| 2006/0108991 | A1 | * | 5/2006  | Jiang et al. ..................... 323/274 |
| 2007/0090819 | A1 | * | 4/2007  | Hasegawa et al. ............ 323/282 |
| 2009/0256542 | A1 | * | 10/2009 | Shiga et al. ................... 323/284 |
| 2009/0257289 | A1 | * | 10/2009 | Byeon ....................... 365/189.09 |
| 2010/0097042 | A1 | * | 4/2010  | Hsieh ............................ 323/282 |
| 2011/0074373 | A1 | * | 3/2011  | Lin ............................... 323/282 |
| 2011/0084675 | A1 | * | 4/2011  | Kawagoshi ................... 323/282 |
| 2011/0279101 | A1 | * | 11/2011 | Sasaki et al. ................. 323/271 |
| 2012/0112725 | A1 | * | 5/2012  | Li et al. ........................ 323/297 |

FOREIGN PATENT DOCUMENTS

| KR | 1020040033744 A | 4/2004 |
| KR | 10-0553681 B1 | 2/2006 |
| KR | 10-2009-0090180 A | 8/2009 |
| KR | 1020090075107 A | 8/2009 |
| KR | 10-2011-0047346 A | 5/2011 |

* cited by examiner

*Primary Examiner* — Timothy J Dole
*Assistant Examiner* — Yusef Ahmed
(74) *Attorney, Agent, or Firm* — William Park & Associates Patent Ltd.

(57) ABSTRACT

A voltage regulator includes a voltage output unit configured to output an output voltage to a voltage output terminal; a first resistance divider configured to regulate a divided resistance value in response to a first series of control signals; and a second resistance divider configured to regulate the divided resistance value, which is determined in the first resistance divider, in response to a second series of control signals. A voltage level of the output voltage output through the voltage output terminal is regulated according to a ratio of the divided resistance value determined through the first resistance divider and the second resistance divider and a resistance value of a reference resistor.

13 Claims, 3 Drawing Sheets

FIG.3

| | | Conventional Circuit | Proposed Scheme | Conventional Size | Proposed Scheme Size | Effect |
|---|---|---|---|---|---|---|
| PE 2st Regulator | Level Shift | 147 | 34 | 147x30x31 =0.137mm² | 34x30x31 =0.032mm² | 0.105mm² |
| | Pass DIV TR. | 147 | 34 | 0.14mm² | 0.06mm² | 0.08mm² |
| | PE 2st REG | -- | -- | | | |
| | Signal Line | 147 | 34 | | | |
| | Logic PNR Area | -- | -- | 0.044mm² | 0.029mm² | 0.015mm² |
| PE 1st Regulator | Level Shift | 34 | Share | 34x30x31 =0.032mm² | PE 2st Level Shift | 0.032mm² |
| | Pass DIV TR. | 34 | 30 | -- | -- | -- |
| | Signal Line | 34 | 30 | -- | -- | -- |
| | Logic PNR Area | -- | -- | 0.014mm² | -- | -- |

−0.232mm² Reduction

VOLTAGE REGULATOR AND VOLTAGE REGULATION METHOD

CROSS-REFERENCES TO RELATED APPLICATION

The present application claims priority under 35 U.S.C. §119(a) to Korean Application No. 10-2011-0003606, filed on Jan. 13, 2011, in the Korean Intellectual Property Office, which is incorporated herein by reference in its entirety as if set forth in full.

BACKGROUND

1. Technical Field

Various embodiments of the present invention relate to a semiconductor apparatuses and related methods. In particular, certain embodiments related to a technology for constructing a voltage regulator.

2. Related Art

A semiconductor apparatus typically receives an external power to generate internal voltages with various voltage levels, and operates internal circuits using the internal voltages. The semiconductor apparatus regulates the internal voltages according to specific use. For example, in a flash memory device, since the level of a voltage applied to word lines is regulated according to a specific operation mode, an output voltage for performing a specific operation using a voltage regulator is output to the word lines.

FIG. 1 is a configuration diagram of a typical voltage regulator.

Referring to FIG. 1, the voltage regulator may include a voltage output unit 10 and a resistance division unit 20.

The voltage output unit 10 outputs an output voltage VPGMERA to a voltage output terminal NO. The voltage output unit 10 includes a comparator 11, which compares a divided voltage V_DIV with a reference voltage VREF and outputs a control voltage V_CTRL based on a comparison result, and a voltage driver 12 which outputs the output voltage VPGMERA with a level corresponding to the level of the control voltage V_CTRL to the voltage output terminal NO.

The resistance division unit 20 includes a plurality of first resistors R0 and R1_0 to R1_146, a plurality of switches MN0 to MN146, and a reference resistor R2. The plurality of first resistors R0 and R1_0 to R1_146 are coupled in series between the voltage output terminal NO and a first node L1. Each of the plurality of switches MN0 to MN146 is coupled between one end of each of the plurality of first resistors R0 and R1_0 to R1_146 and the first node L1, respectively, and is selectively turned on in response to control codes S0 to S146. The reference resistor R2 is coupled between the first node L1 and a ground voltage terminal VSS.

The voltage level of the output voltage VPGMERA output through the voltage output terminal NO is regulated according to the ratio of a divided resistance value R3 determined through the resistance division unit 20 and a resistance value of the reference resistor R2. That is, when the plurality of switches MN0 to MN146 are selectively turned on according to the code values of the control codes S0 to S146, one or more first resistors R0 and R1_0 to R1_146 are selected, so that the divided resistance value R3 is determined. The voltage level of the output voltage VPGMERA increases as the divided resistance value R3 increases.

Meanwhile, in order to expand a regulation range of the output voltage VPGMERA or more precisely regulate the voltage level of the output voltage VPGMERA, the number of the switches and the resistors comprising the resistance division unit 20 should increase. However, if the number of the switches increases, the number of bits of the control codes for controlling the switches should also increase. Since the control codes are generated through level shifts, the number of the level shifts should also increase. Since the typical voltage regulator as described above occupies a large area, a technology for solving such problem is necessary.

SUMMARY

Accordingly, there is a need for an improved voltage regulator that can precisely regulate the voltage of the output voltage while occupying a small area.

To attain the advantages and in accordance with the purposes of the invention, as embodied and broadly described herein, one exemplary aspect of the present invention may provide a voltage regulator which includes: a voltage output unit configured to output an output voltage to a voltage output terminal; a first resistance divider configured to regulate a divided resistance value in response to a first series of control signals; and a second resistance divider configured to regulate the divided resistance value, which is determined in the first resistance divider, in response to a second series of control signals. A voltage level of the output voltage output through the voltage output terminal is regulated according to a ratio of the divided resistance value determined through the first resistance divider and the second resistance divider and a resistance value of a reference resistor.

According to another exemplary aspect of the present invention, a voltage regulator may include: a voltage output unit configured to output an output voltage to a voltage output terminal; a voltage control signal generation unit configured to generate a plurality of control signal sets; and a plurality of resistance dividers configured to determine a divided resistance value according to code combinations of the plurality of control signal sets. A voltage level of the output voltage output through the voltage output terminal is regulated according to a ratio of the divided resistance value determined through the plurality of resistance dividers and a resistance value of a reference resistor.

According to still another exemplary aspect of the present invention, a voltage regulation method may include: regulating a divided resistance value through a first resistance divider including a plurality of first voltage pull-down elements; regulating the divided resistance value, which is determined in the first resistance divider, through a second resistance divider including a plurality of second voltage pull-down elements; and regulating the divided resistance value, which is determined in the first resistance divider, through a second resistance divider including a plurality of second voltage pull-down elements.

According to still another exemplary aspect of the present invention, a voltage regulator may include: a comparator configured to compare a voltage level of a divided voltage output from a second node with a voltage level of a reference voltage and output a control voltage with a voltage level based on a comparison result; a voltage driver configured to output an output voltage with a level according to a voltage level of the control voltage to a voltage output terminal; a plurality of first voltage pull-down elements coupled in series between the voltage output terminal and a first node; a plurality of first switches coupled between one end of each of the plurality of first voltage pull-down elements and the first node, respectively, and are selectively turned on in response to a first series of control signals; a plurality of second voltage pull-down elements coupled in series between the first node and the second node; a plurality of second switches coupled between one end of each of the plurality of second voltage pull-down elements and the second node, respectively, and are selectively turned on in response to a second series of control signals; and a reference resistor coupled between the second node and a ground voltage terminal.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

FIG. 3 is a diagram illustrating the characteristics of the voltage regulator illustrated in FIG. 2.

DETAILED DESCRIPTION

Hereinafter, embodiments of the present invention will be described in detail with reference to the accompanying drawings such that the scope of the present invention can be easily embodied by those skilled in the art. For reference, since terms, symbols and signs that are used in drawings and in this detailed description to designate devices, blocks, and so on may be used for detailed units as the occasion demands, it is to be noted that the same terms, symbols and signs may not designate the same devices, blocks, and so on in an entire circuitry. In general, the logic signals of a circuit and binary data values are divided into a high level (H) or a low level (L) in correspondence to voltage levels and may be represented as '1' and '0'. Furthermore, as the occasion demands, a high impedance state (a high-Z state) may be defined and described.

Figure 1:
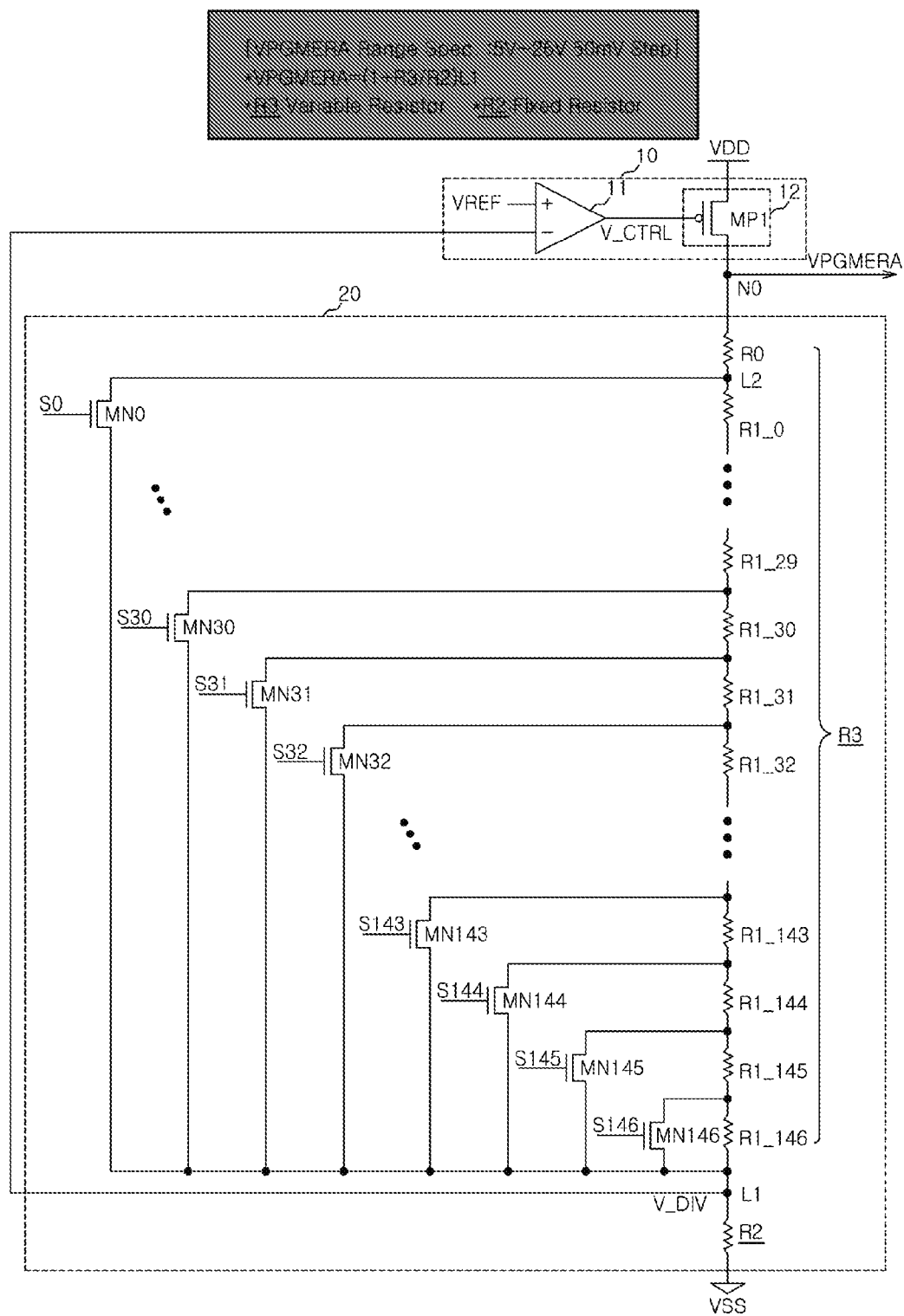
FIG. 1 is a configuration diagram of a typical voltage regulator.
Figure 2:
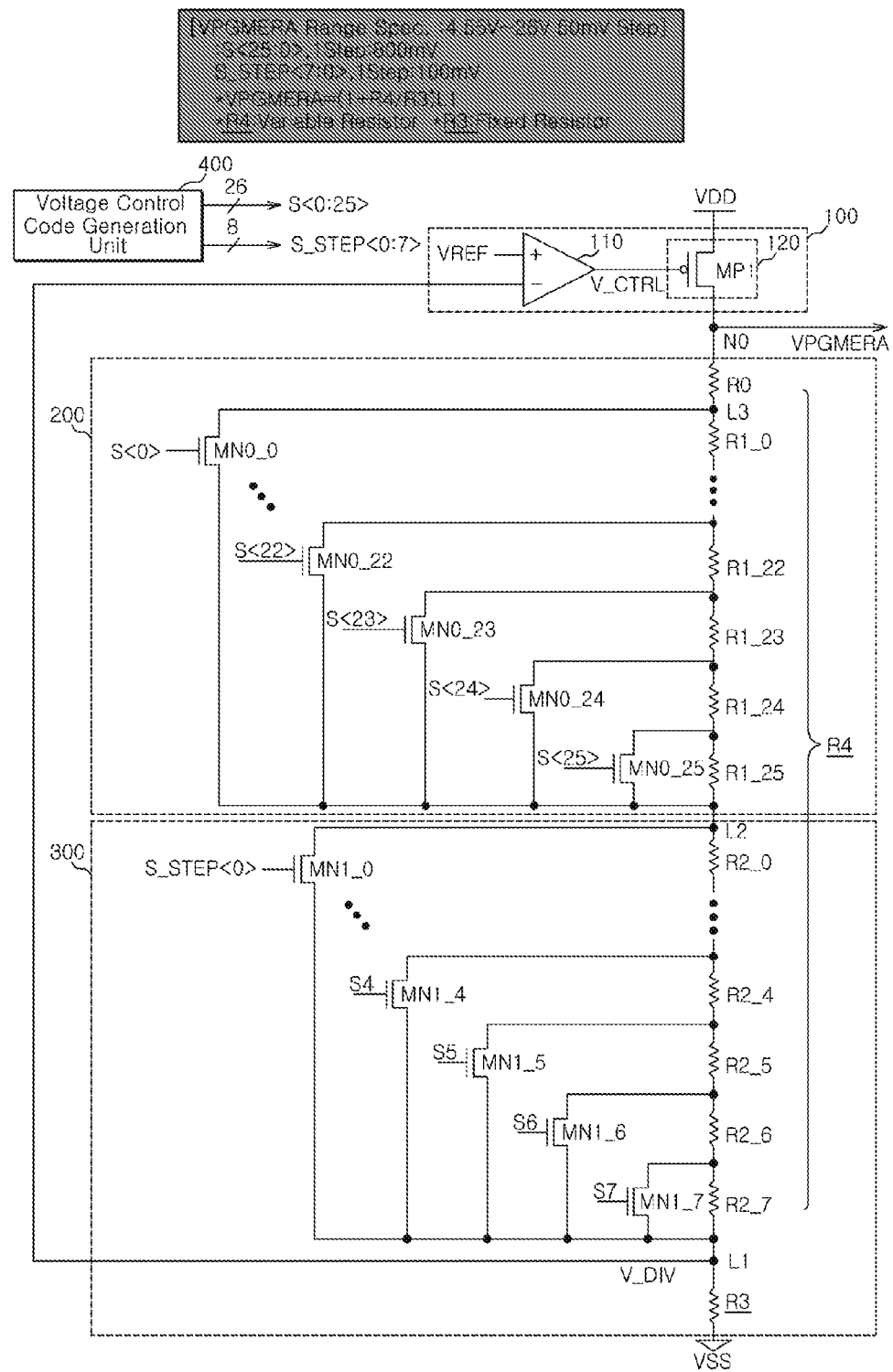
FIG. 2 is a configuration diagram of a voltage regulator according to one exemplary embodiment.

FIG. 2 is a configuration diagram of a voltage regulator according to one embodiment.

The voltage regulator according to the embodiment illustrates a simplified structure of the voltage regulator to clearly explain the technical spirit intended to be provided herein.

Referring to FIG. 2, the voltage regulator may include a voltage output unit 100, a plurality of resistance dividers, and a voltage control code generation unit 400. The number of the plurality of resistance dividers may vary depending on embodiments. In this embodiment, it is assumed that two resistance dividers, that is, a first resistance divider 200 and a second resistance divider 300 are provided.

The detailed structure and major operations of the voltage regulator configured as above will be described below.

The voltage output unit 100 may be configured to output an output voltage VPGMERA to a voltage output terminal NO. In this embodiment, the voltage output unit 100 may include a comparator 110 and a voltage driver 120. The comparator 110 may be configured to compare the voltage level of a divided voltage V_DIV generated in the first resistance divider 200 and the second resistance divider 300 with the voltage level of a reference voltage VREF, and output a control voltage V_CTRL with a level based on a comparison result. The voltage driver 120 may be configured to output the output voltage VPGMERA to the voltage output terminal NO with a voltage level corresponding to the level of the control voltage V_CTRL. That is, it is possible to constantly maintain the voltage level of the output voltage VPGMERA through the comparator 110 and the voltage driver 120.

The voltage control code generation unit 400 may be configured to generate a plurality of sets of control codes, or series of control signals. A divided resistance value of the plurality of resistance dividers is determined according to code combinations of the plurality of sets of control codes. In this embodiment, it is assumed that the voltage control code generation unit 400 generates a first set of control codes S<0:25> and a second set of control codes S_STEP<0:7>. The voltage control code generation unit 400 may be configured to regulate the voltage levels of the first set of control codes S<0:25> and the second set of control codes S_STEP<0:7> through level shifters provided therein. The voltage levels of the first set of control codes S<0:25> and the second set of control codes S_STEP<0:7> may be set high enough such that a plurality of first switches MN0_0 to MN0_25 comprising the first resistance divider 200 and a plurality of second switches MN1_0 to MN1_7 comprising the second resistance divider 300 may sufficiently transfer voltages. In more detail, the plurality of first switches MN0_0 to MN0_25 and the plurality of second switches MN1_0 to MN1_7 include NMOS transistors, respectively. The voltage levels of the first set of control codes S<0:25> and the second set of control codes S_STEP<0:7>, which control the NMOS transistors, should be determined such that a voltage difference between a gate terminal and a source terminal of each NMOS transistor may be sufficiently generated.

The first resistance divider 200 is configured to primarily regulate a divided resistance value R4 in response to the first set of control codes S<0:25>, and the second resistance divider 300 is configured to secondarily and precisely regulate the divided resistance value R4, which is determined in the first resistance divider 200, in response to the second set of control codes S_STEP<0:7> and determine a final divided resistance value R4. In this embodiment, the final divided resistance value R4 may be obtained by summing a resistance value formed in the first resistance divider 200 and a resistance value formed in the second resistance divider 300. In this embodiment, the first resistance divider 200 may include a plurality of first voltage pull-down elements R0 and R1_0 to R1_25 coupled in series between the voltage output terminal NO and a first node L2, and the plurality of first switches MN0_0 to MN0_25 coupled between one end of each of the plurality of first voltage pull-down elements R0 and R1_0 to R1_25 and the first node L2, respectively, and are selectively turned on in response to the first set of control codes S<0:25>. The second resistance divider 300 may include a plurality of second voltage pull-down elements R2_0 to R2_7 coupled in series between the first node L2 and a second node L1, and the plurality of second switches MN1_0 to MN1_7 coupled between one end of each of the plurality of second voltage pull-down elements R2_0 to R2_7 and the second node L1, respectively, and are selectively turned on in response to the second set of control codes S_STEP<0:7>. In this embodiment, the plurality of first voltage pull-down elements R0 and R1_0 to R1_25 and the plurality of second voltage pull-down elements R2_0 to R2_7 include resistors, respectively. According to embodiments, they may include active resistor elements and the like, respectively. Furthermore, according to embodiments, the plurality of first voltage pull-down elements R0 and R1_0 to R1_25 and the plurality of second voltage pull-down elements R2_0 to R2_7 may include a plurality of elements having the same resistance value, or a plurality of elements having resistance values different from each other.

The reference resistor R3 may be coupled between the second node L1 and a ground voltage terminal VSS. In this embodiment, the first resistance divider 200, the second resistance divider 300, and the reference resistor R3 may be coupled in series between the voltage output terminal NO and the ground voltage terminal VSS. Thus, the voltage level of the output voltage VPGMERA output through the voltage output terminal NO is regulated according to the ratio of the divided resistance value R4 finally determined through the first resistance divider 200 and the second resistance divider 300 and a resistance value of the reference resistor R3. The voltage level of the output voltage VPGMERA increases as the divided resistance value R4 increases.

TABLE 1

| | 0.1 | | S<1> | |
|---|---|---|---|---|
| S_STEP | VPGMERA | R4 | R3 | R4/R3 |
| 7 | 6.95 | 57 | 12.5 | 4.56 |
| 6 | 6.85 | 56 | 12.5 | 4.48 |
| 5 | 6.75 | 55 | 12.5 | 4.4 |
| 4 | 6.65 | 54 | 12.5 | 4.32 |
| 3 | 6.55 | 53 | 12.5 | 4.24 |
| 2 | 6.45 | 52 | 12.5 | 4.16 |
| 1 | 6.35 | 51 | 12.5 | 4.08 |
| 0 | 6.25 | 50 | 12.5 | 4 |

TABLE 2

| | 0.1 | | S<0> | |
|---|---|---|---|---|
| S_STEP | VPGMERA | R4 | R3 | R4/R3 |
| 7 | 6.15 | 49 | 12.5 | 3.92 |
| 6 | 6.05 | 48 | 12.5 | 3.84 |
| 5 | 5.95 | 47 | 12.5 | 3.76 |
| 4 | 5.85 | 46 | 12.5 | 3.68 |
| 3 | 5.75 | 45 | 12.5 | 3.6 |
| 2 | 5.65 | 44 | 12.5 | 3.52 |
| 1 | 5.55 | 43 | 12.5 | 3.44 |
| 0 | 5.45 | 42 | 12.5 | 3.36 |

Tables 1 and 2 above illustrate a part of the output voltage VPGMERA finally determined by the ratio of the divided resistance value R4 determined by the first resistance divider 200 and the second resistance divider 300 of the voltage regulator of FIG. 2 and the resistance value of the reference resistor R3.

In the case where the divided resistance value is finally determined through a plurality of resistance dividers according to this embodiment, it is possible to reduce the number of switches and the number of level shifts necessary when the voltage regulation range of the voltage regulator is wide or should be regulated very precisely.

The voltage regulation method as described above includes regulating a divided resistance value through a first resistance divider including a plurality of first voltage pull-down elements, regulating the divided resistance value, which is determined in the first resistance divider, through a second resistance divider including a plurality of second voltage pull-down elements, and determining the voltage level of an output voltage according to the ratio of a divided resistance value finally determined through the first resistance divider and the second resistance divider and a resistance value of a reference resistor. The step of regulating the divided resistance value through the first resistance divider may further include the steps of selecting one or more of the plurality of first voltage pull-down elements in response to first set of control codes and regulating the voltage levels of the first set of control codes through level shifters. Furthermore, the step of regulating the divided resistance value through the second resistance divider may further include the steps of selecting one or more of the plurality of second voltage pull-down elements in response to second set of control codes and regulating the voltage levels of the second set of control codes through level shifters.

FIG. 3 is a diagram illustrating the characteristics of the voltage regulator illustrated in FIG. 2.

FIG. 3 illustrates the characteristics of the voltage regulator thus described, which are compared with the characteristics of a typical voltage regulator. It is assumed that the two compared voltage regulators have the same voltage level regulation range.

As is apparent from FIG. 3, in the voltage regulator employing the invention, the number of level shifts, the number of pass DIV transistors, the number of signal lines and the like are reduced and a layout area is significantly reduced, as compared with the typical voltage regulator.

So far, the embodiment of the present invention has been described in detail. For reference, embodiments including additional component elements, which are not directly associated with the technical spirit of the present invention, may be exemplified in order to describe the present invention in further detail. Moreover, an active high configuration or an active low configuration for indicating the activated states of signals and circuits may vary depending upon an embodiment. Furthermore, the configurations of transistors may be changed as the occasion demands in order to realize the same function. That is to say, the configurations of a PMOS transistor and an NMOS transistor may be replaced with each other, and as the occasion demands, various transistors may be employed. Furthermore, the configurations of logic gates may be changed as the occasion demands in order to realize the same function. Since these embodiment changes have a large number of cases and can be easily inferred by those skilled in the art, the enumeration thereof will be omitted herein.

While certain embodiments have been described above, it will be understood to those skilled in the art that the embodiments described are by way of example only. Accordingly, a voltage regulator and a voltage regulation method described herein should not be limited based on the described embodiments. Rather, the voltage regulator and the voltage regulation method described herein should only be limited in light of the claims that follow when taken in conjunction with the above description and accompanying drawings.

What is claimed is:

1. A voltage regulator comprising:
a voltage output unit configured to output an output voltage to a voltage output terminal; a first resistance divider configured to regulate a first resistance value in response to a first series of control signals; and a second resistance divider configured to regulate a second resistance value, in response to a second series of control signals; wherein a voltage level of the output voltage output through the voltage output terminal is regulated according to a ratio a resistance value of a reference resistor and a sum of the first resistance value and the second resistance value;

wherein the first resistance divider comprises: a plurality of first voltage pull-down elements coupled in series between the voltage output terminal and a first node; and a plurality of first switches coupled between one end of each of the plurality of first voltage pull-down elements and the first node, respectively, and are selectively turned on in response to the first series of control signals.

2. The voltage regulator according to claim 1, wherein the first resistance divider, the second resistance divider, and the reference resistor are coupled in series between the voltage output terminal and a ground voltage terminal.

3. The voltage regulator according to claim 1, wherein the voltage output unit comprises:
   a comparator configured to compare a voltage level of a divided voltage formed in the first resistance divider and the second resistance divider with a voltage level of a reference voltage and output a control voltage with a voltage level based on a comparison result; and
   a voltage driver configured to output the output voltage with a level according to the voltage level of the control voltage to the voltage output terminal.

4. The voltage regulator according to claim 1, wherein the second resistance divider comprises:
   a plurality of second voltage pull-down elements coupled in series between the first node and a second node; and
   a plurality of second switches coupled between one end of each of the plurality of second voltage pull-down elements and the second node, respectively, and are selectively turned on in response to the second series of control signals.

5. The voltage regulator according to claim 4, wherein the reference resistor is coupled between the second node and a ground voltage terminal.

6. A voltage regulation method comprising:
   regulating a first resistance value through a first resistance divider; regulating a second resistance value, through a second resistance divider including a plurality of second voltage pull-down elements; and regulating a voltage level of an output voltage according to a sum of the first resistance value and the second resistance value;
   wherein the first resistance divider comprises: a plurality of first voltage pull-down elements coupled in series between the voltage output terminal and a first node; and a plurality of first switches coupled between one end of each of the plurality of first voltage pull-down elements and the first node, respectively, and are selectively turned on in response to the first series of control signals.

7. The voltage regulation method according to claim 6, wherein regulating the first resistance value through the first resistance divider further comprises:
   selecting one or more of the plurality of first voltage pull-down elements in response to a first series of control signals.

8. The voltage regulation method according to claim 7, wherein regulating the first resistance value through the first resistance divider further comprises:
   regulating a voltage level of the first series of control signals through level shifters.

9. The voltage regulation method according to claim 8, wherein regulating the second resistance value through the second resistance divider further comprises:
   selecting one or more of the plurality of second voltage pull-down elements in response to a second series of control signals.

10. The voltage regulation method according to claim 9, wherein regulating the second resistance value through the second resistance divider further comprises:
    regulating a voltage level of the second series of control signals through level shifters.

11. A voltage regulator comprising:
    a comparator configured to compare a voltage level of a divided voltage output from a second node with a voltage level of a reference voltage and output a control voltage with a voltage level based on a comparison result;
    a voltage driver configured to output an output voltage with a level according to a voltage level of the control voltage to a voltage output terminal;
    a plurality of first voltage pull-down elements coupled in series between the voltage output terminal and a first node;
    a plurality of first switches coupled between one end of each of the plurality of first voltage pull-down elements and the first node, respectively, and are selectively turned on in response to a first series of control signals;
    a plurality of second voltage pull-down elements coupled in series between the first node and the second node;
    a plurality of second switches coupled between one end of each of the plurality of second voltage pull-down elements and the second node, respectively, and are selectively turned on in response to a second series of control signals; and
    a reference resistor coupled between the second node and a ground voltage terminal,
    wherein the divided voltage from the second node is regulated according to a sum of a resistance value determined by the first series of control signals and a resistance value determined by the second series of control signals.

12. The voltage regulator according to claim 11, further comprising:
    a voltage control signal generation unit configured to generate the first series of control signals and the second series of control signals.

13. The voltage regulator according to claim 12, wherein the voltage control signal generation unit is configured to regulate a voltage level of the first series of control signals and a voltage level of the second series of control signals through level shifts.

* * * * *